(12) United States Patent
Yoshida et al.

(10) Patent No.: US 6,576,927 B2
(45) Date of Patent: Jun. 10, 2003

(54) SEMICONDUCTOR DEVICE AND GAN-BASED FIELD EFFECT TRANSISTOR FOR USE IN THE SAME

(75) Inventors: Seikoh Yoshida, Tokyo (JP); Hironari Takehara, Tokyo (JP); Takahiro Wada, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/084,717

(22) Filed: Feb. 25, 2002

(65) Prior Publication Data

US 2002/0125506 A1 Sep. 12, 2002

(30) Foreign Application Priority Data

Mar. 6, 2001 (JP) .......................................... 2001-062323
Mar. 27, 2001 (JP) .......................................... 2001-090323

(51) Int. Cl.[7] ............................................... H01L 29/76
(52) U.S. Cl. .......................... 257/67; 257/401; 257/615
(58) Field of Search ........................... 257/67, 74, 401, 257/615, 192, 366, 278, 287

(56) References Cited

U.S. PATENT DOCUMENTS 5,606,186 A * 2/1997 Noda .......................... 257/226

\* cited by examiner

*Primary Examiner*—Mark V. Prenty
(74) *Attorney, Agent, or Firm*—Oblon, Spivak, McClelland, Maier & Neustadt, P.C.

(57) ABSTRACT

The present invention provides a semiconductor device as an FET integrated object having a small effective area, a small ON resistance during operation, a high voltage resistance, and capable of large-current drive. This device comprises one or more FET's each having a gate electrode, a source electrode, and a drain electrode, and arranged side by side on a single plane to constitute a first block which is stacked on a second block having a configuration identical to the first block, wherein the gate electrode, the source electrode, and the drain electrode of the FET(s) of the first block are directly joined with the gate electrode, the source electrode, and the drain electrode of the FET(s) of the second block, respectively.

6 Claims, 6 Drawing Sheets

SEMICONDUCTOR DEVICE AND GAN-BASED FIELD EFFECT TRANSISTOR FOR USE IN THE SAME

FIELD OF THE INVENTION

The present invention relates to a semiconductor device and a GaN-based field effect transistor suitably used for the semiconductor device, and more particularly, it relates to a field effect transistor (FET) integrated structure capable of substantially reducing an area of an electrode formed on the FET, which in turn reduces the entire semiconductor device of large current drive. Additionally, the present invention relates to a GaN-based FET that has a small ON resistance and can easily realize a pinch-off state, a high-temperature operation, and large-current drive.

BACKGROUND OF THE INVENTION

Recently, an FET having MIS (metal-insulator-semiconductor) structure has been developed, in which a GaAs-based material is the main compound semiconductor used.

The GaAs-based FET is normally produced as follows.

Firstly, on a substrate such as a sapphire substrate, a semi-insulating layer is formed of non-doped GaAs by using the MOCVD method for example. Furthermore, an active layer of Si doped n-AlGaAs is formed on the semi-insulating layer. Then, on this active layer, an $SiO_2$ film is formed by the plasma CVD method for example, and photolithography and etching are performed to form an opening of a desired pattern.

Furthermore, from the opening, a predetermined electrode material is deposited, thereby forming operation electrodes such as a gate electrode, a source electrode, and a drain electrode on the aforementioned active layer (Si doped nAlGaAs layer) so as to constitute a planar type FET.

Recently, the FET is widely used as a switching element mounted on an automobile. The FET for such an application field should reduce its weight and size and should be able to operate under a high temperature, considering the temperature in an engine room. Moreover, such application requires capability of large-current drive. For the latter requirement, the aforementioned GaAs-based FET does not exhibit a satisfactory characteristic.

As part of making their invention, the inventors have recognized that, on the other hand, the GaN-based compound semiconductor such as GaN, AlGaN, and InGaAlN can operate at a high temperature as compared to GaAs and Si. Moreover, they have a wide discontinuous band gap at the hetero-junction boundary and if they are used as the active layer on which a gate electrode is formed, it is possible to obtain an FET capable of operating under a high temperature and a high voltage can be applied to the FET.

OBJECT AND SUMMARY OF THE INVENTION

It is therefore an object of the present invention to provide a semiconductor device that is an FET integrated structure that can substantially reduce the area of the electrode formed on the surface of the FET structure and can reduce the size of the entire device.

Another object of the present invention to provide a semiconductor device using an FET having a small ON resistance during operation and a large-current drive.

Still another object of the present invention is to provide a GaN-based FET having a small ON resistance, not causing leak current, and having a structure capable of easily obtaining a pinch-off state, i.e., to provide a GaN-based FET that can preferably be used as an FET for the aforementioned semiconductor device.

In order to achieve the aforementioned objects, the present invention provides a semiconductor device comprising:

at least one field effect transistor plainly arranged so as to form one block;

at least one field effect transistor plainly arranged on the one block so as to form another block; and a gate electrode, a source electrode, and a drain electrode formed on the surface of each of the field effect transistors;

wherein the gate electrode, the source electrode, and the drain electrode of the field effect transistor of the one block are directly joined with the gate electrode, the source electrode, and the drain electrode of the field effect transistor of the other block, respectively.

Moreover, the present invention provides a GaN-based field effect transistor to be used in the aforementioned semiconductor device, the transistor comprising a lower electrode formed from the same material as a gate electrode to be formed and patterned on the same plane as the gate electrode directly on a semi-insulating substrate; an active layer having at least one layer formed from a GaN-based compound semiconductor where the lower electrode is buried; and the gate electrode formed on the upper surface of the active layer so that the gate electrode and the lower electrode vertically sandwich the active layer.

DETAILED DESCRIPTION

In the case of FET, it is most preferable that the ON resistance during operation be zero and the pinch-off state be realized. Actually, however, no FET's which are driven in such conditions have been realized yet.

In order to approach the aforementioned state as much as possible, an area of the gate electrode located immediately on the active layer is increased. More specifically, the gate length is increased, so that a high electric field can be applied to an entire FET-structure channel so as to reduce the ON resistance during operation.

Accordingly, in the case of the planar type FET, in order to reduce the ON resistance during operation, the entire area forming the gate electrode occupies a significantly large proportion of the FET surface. That is, the FET has a large size as a whole.

Moreover, when a plurality of FET's are arranged on a single plane so as to constitute a large-current drive device as a whole, the respective FET areas are increased and accordingly, the entire device is significantly large-sized.

On the other hand, the GaN-based FET currently obtainable has the advantage of the ON resistance during operation being reduced by one to three digits as compared to the conventional Si and GaAs-based FET. However, much ON resistance is still present due to the insufficient crystal growth technique and electrode forming technique.

Moreover, even when a significantly high electric field is applied from the gate electrode to the active layer located immediately below the gate electrode, no depletion layer is formed to completely cut off the channel in the gate portion. For this reason, it is impossible to realize a sufficient pinch-off state and a leak current may flow between the source electrode and the drain electrode.

Furthermore, in the case of the GaN-based FET, the FET structure is normally formed on a semi-insulating substrate such as a sapphire substrate. Accordingly, to lower an FET rise voltage, the gate length should be sufficiently long. As a result, even in the case of the GaN-based FET, its area becomes large.

To form a gate electrode having a very long gate length, it is necessary to prepare a large-area wafer for crystal growth. That is, when a wafer of a predetermined area is used, the FET production yield becomes lower.

Additionally, when reducing the channel resistance by increasing the channel thickness, for example, it becomes necessary to increase the channel carrier concentration by employing a dual diffusion technique which is applied in producing a large scale integrated circuit. Thus, various problems are involved in producing the GaN-based FET capable of large current drive.

The present invention has been developed to solve the aforementioned various problems as follows.

Firstly, explanation will be given on the semiconductor according to the present invention.

Figure 1:
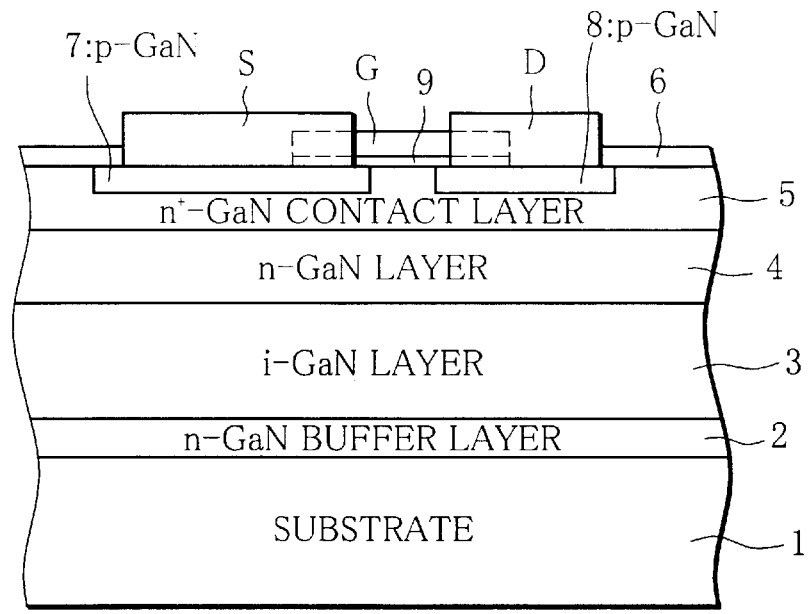
FIG. 1 is a cross sectional view of an FET unit used in the device according to the present invention.

FIG. 1 is a cross sectional view showing an example of layered structure of an FET unit constituting the semiconductor device of the present invention.

The layered structure of the FET unit is formed by the gas source molecular beam epitaxial (GSMBE) method for example, using a vacuum device having a crystal growth chamber and a patterning chamber.

Firstly, in the growth chamber, on the semi-insulating sapphire substrate 1, radical nitrogen ($3 \times 10^{-6}$ Torr), metal Ga ($5 \times 10^{-7}$ Torr), and metal Si ($5 \times 10^{-9}$ Torr) are used to form an n-GaN buffer layer 2 of 50 nm thickness at a growth temperature of 640° C. Furthermore, on this buffer layer 2, metal Ga ($1 \times 10^{-6}$ Torr) and ammonia ($5 \times 10^{-5}$ Torr) are used to form an undoped i-GaN layer 3 of 1000 nm thickness at a growth temperature of 850° C.

Subsequently, metal Ga ($1 \times 10^{-6}$ Torr), ammonia ($5 \times 10^5$ Torr), and metal Si ($5 \times 10^{-10}$ Torr) as an n-type dopant are used to form an n-GaN layer 4 having a carrier concentration of $1 \times 10^{17}$ cm$^{-3}$ and a thickness of 200 nm. Furthermore, thereon, metal Ga ($1 \times 10^{-6}$ Torr), ammonia ($5 \times 10^{-5}$Torr), and metal Si ($1 \times 10^{-8}$ Torr) as an n-type dopant are used to form an n$^+$-GaN contact layer 5 having a carrier concentration of $1 \times 10^{19}$ cm$^{-3}$ and a thickness of 100 nm.

The layered n$^+$-GaN contact layer 5 thus formed is entirely covered with an SiO$_2$ film 6, as a protection film, formed to have a thickness of 200 nm by thermochemical deposition method. Subsequently, the photolithography method and the dry etching method are employed to perform patterning on the SiO$_2$ film 6 so as to remove portions of the SiO$_2$ film 6 corresponding to a source electrode, a drain electrode, and gate electrode to be formed. On the contact layer 5 exposed via opening regions of the source electrode and the drain electrode, a reverse layer is formed by using dicyclopentadienyl Mg as a p-type dopant. Subsequently, on the region of the gate electrode, an SiO$_2$ film 9 is deposited by 1000 Å to serve as an insulation gate film.

Furthermore, to form an operation electrode, patterning is performed using photoresist. That is, the region of the gate electrode is masked, while in the regions of the source electrode and the drain electrode, Al, Ti, and Au are successively deposited to form a source electrode S and a drain electrode D. Next, the source electrode and the drain electrode are masked while in the region of the gate electrode, Pt and Au are successively deposited in this order to form a gate electrode G.

Figure 2A:
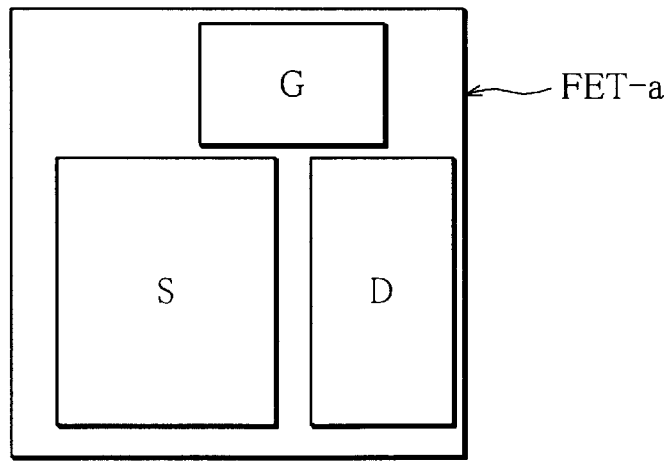
FIG. 2A is a plan view showing arrangement of the electrodes of the FET-a of FIG. 1.
Figure 2B:
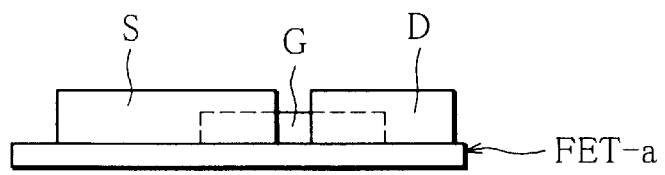
FIG. 2B is a side view of the FET-a shown in FIG. 2A.

The FET structure thus prepared is cut into a predetermined size to obtain an FET-a having the gate electrode G, the source electrode S, and the drain electrode D arranged on the surface as shown in FIG. 2.

Figure 3A:
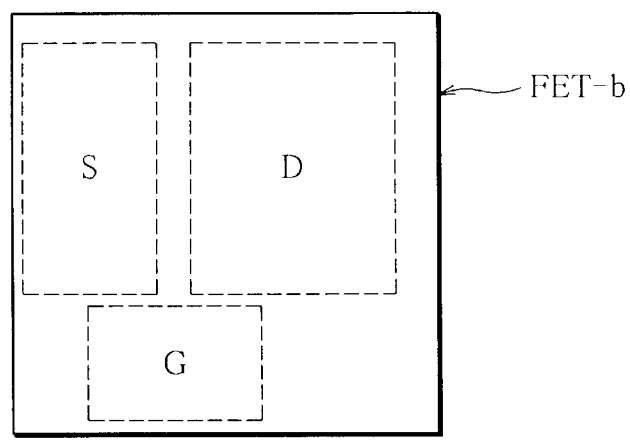
FIG. 3A is a plan view showing arrangement of the electrodes of another FET-b.
Figure 3B:
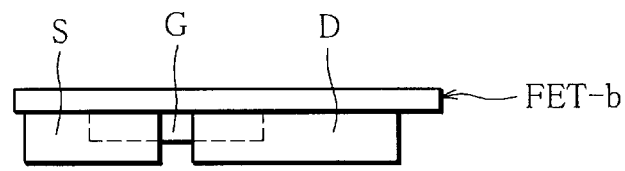
FIG. 3B is a side view of the FET-b shown in FIG. 3A.

On the other hand, an FET-b is prepared in the same way as the FET-a but the source electrode S, the drain electrode D, and the gate electrode G are arranged as shown in FIG. 3. It should be noted that FIG. 3 shows arrangement of the electrodes S, D, G when viewed from the back surface of the substrate.

Subsequently, explanation will be given on a semiconductor device of the present invention.

Figure 4A:
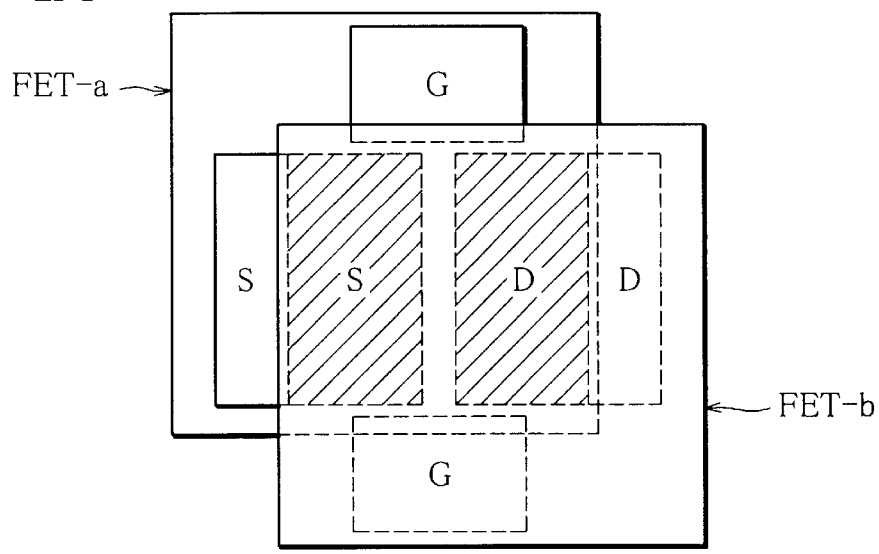
FIG. 4A is a plan view showing arrangement of the electrodes when the FET-a and FET-b are stacked one on top of the other.
Figure 4B:
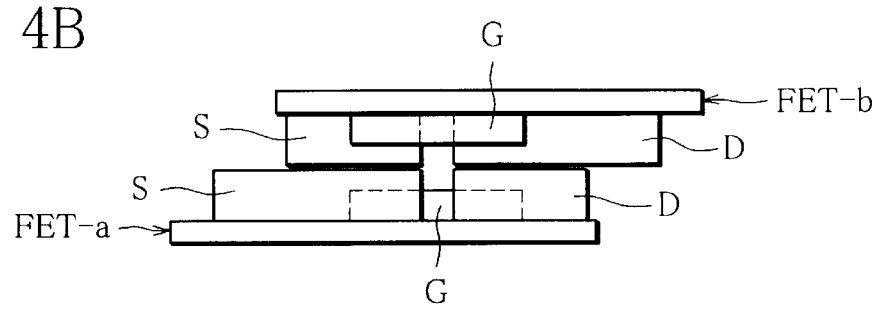
FIG. 4B is a side view of the stacked arrangement shown in FIG. 4A.

FIG. 4 shows an example.

In this example, the FET-a is used as one bock and the FET-b is used as the other block and they are stacked one on the other.

Firstly, the FET-a and the FET-b are stacked in such a manner that identical electrodes formed on the surface oppose to each other. That is, on the FET-a shown in FIG. 2A and FIG. 3A, the FET-b is stacked so that the electrodes S and D are in contact to form a stacked body as shown in FIG. 4. In this figure, the electrodes G are not overlaid on each other. And the overlaid region between the source electrode S and the drain electrode D of the FET-a and the source electrode S and the drain electrode D of the FET-b, i.e., the hatched region in FIG. 4 are joined with each other. Here, the source electrodes S and the drain electrodes D of the FET-a and the FET-b are formed in such a manner that one is larger in size than the other and accordingly, when they are stacked one on the other, a part of the source electrode S of the FET-a and a part of the drain electrode D of the FET-b are exposed outside from the stacked region. These exposed regions can be used as pull-out electrodes.

For the junction between the electrodes, it is preferable to use a metal or an alloy that is melted at a comparatively low temperature. More specifically, a material whose melting point is not higher than 600° C. such as soldering, Au—Sn, and Al. When Au—Sn is used for the junction between the electrodes, the temperature is increased up to 400° C. where the Au—Sn is melted to join the electrodes.

It is to be noted that in this semiconductor device, the gate electrodes of the FET-a and the FET-b cannot be stacked one on the other and they are connected by other means.

By using the two-layered semiconductor device composed of the aforementioned FET units, voltage between the source electrode and the drain electrode was measured and it was found that the voltage was saturated at 10A. Moreover, the voltage tightness of this device exceeded 100V. Furthermore, the ON resistance was found to be sufficiently low, i.e., 10 mΩcm$^{-2}$.

It should be noted that in the aforementioned embodiment, a GaN-based semiconductor layer was formed by successive crystal growth by the GSMBE method but it is also possible to use the metal-organic chemical vapor deposition method (MOCVD) for crystal growth of the semiconductor layer. In this case, for forming the GaN layer, it is possible to use an organic metal gas such as triethyl gallium and trimethyl gallium as a Ga source and dimethylhydrazine as a nitrogen source. As the nitrogen source, it is also possible to use monomethylhydrazine and ammonia. Moreover, as the n-type dopant, it is possible to use monosilane, and as the p-type dopant, it is possible to use dicyclopentadienyl Mg and other organic Mg.

Furthermore, in the aforementioned embodiment, GaN was used as the n-type layer, but the n-type is not limited to this. For example, it is also possible to use Si-doped InGaN, InGaAlN, InGaN, InGaNAs, InGaNP, and the like. Moreover, as the p-type layer, it is also possible to use Mg-doped InGaN, InGaAlN, InGaNAs, InGaNP, and the like.

Moreover, in the aforementioned embodiment, the insulating substrate was used as a substrate. However, it is also possible to use a conductive substrate such as SiC, Si, GaAs, and GaP to constitute an FET structure using a GaN-based material.

When a conductive substrate is used, it is possible to form an electrode on the lower surface of the substrate and accordingly, it is possible to constitute a structure having a drain electrode on the lower surface, i.e., a so-called longitudinal FET. In the longitudinal FET structure, it is possible to increase the gate portion area, which is advantageous for reducing the ON resistance.

In the case of such a longitudinal FET structure, by forming a groove by selectively etching the gate electrode region up to the n$^+$-GaN layer 5 and thereon, selectively forming a gate insulation film such as AlN, SiO$_2$, and SiN, it is possible to further increase the effective area of the gate electrode. This structure has a further advantage that large current control can be performed.

Moreover, the FET structure is not limited to the aforementioned embodiment but can also be applied to any of MESFET, HEMT, MISFET, and the like.

Figure 5:
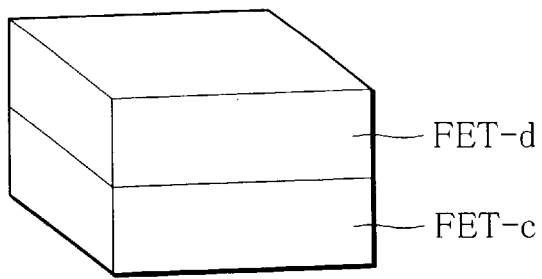
FIG. 5 is a schematic diagram showing another semiconductor device according to the present invention.
Figure 6:
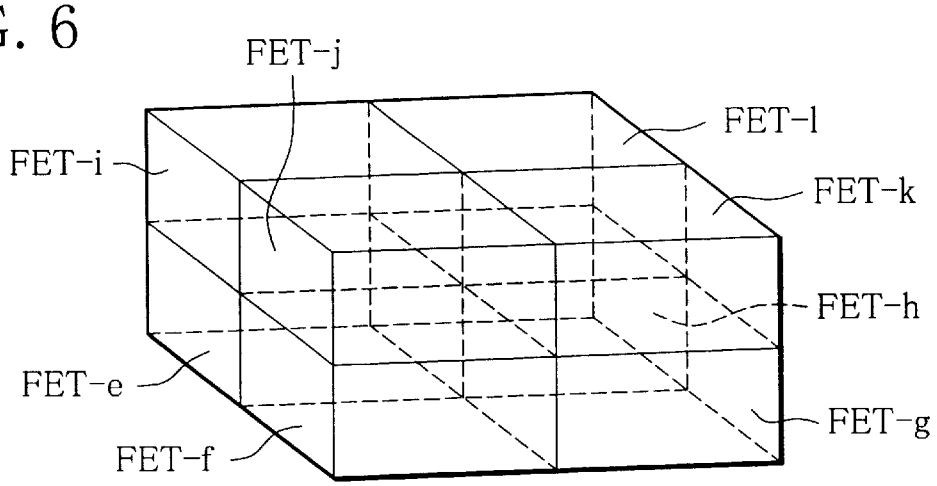
FIG. 6 is a schematic diagram showing still another semiconductor device according to the present invention.
Figure 7:
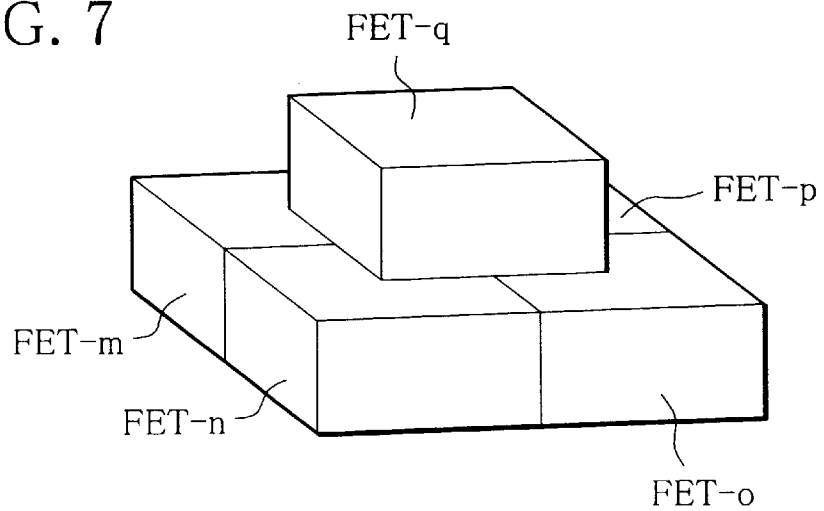
FIG. 7 is a schematic diagram showing still yet another semiconductor device according to the present invention.

FIG. 5 to FIG. 7 show a semiconductor device according to other embodiments of the present invention. FIG. 5 shows an embodiment in which an FET-c and an FET-d having identical shape are stacked one on the other so that electrodes of them are directly joined.

FIG. 6 shows a case using eight FET units: FET-e to FET1 having identical shape. Four FET units, i.e., FET-e to FET-h are arranged side by side on a single plane to constitute one block, on which the other four FET units. i.e., FET-i to FET-l constituting another block are stacked.

FIG. 7 shows a case using five FET units, i.e., FET-m to FET-q having an identical shape. Similarly as in FIG. 6, four FET units, i.e., FET-m to FET-p are arranged side by side on a single plane to constitute one block and on this block, the FET-q is placed.

As is such devices as shown in FIG. 5 and FIG. 6, in the case of the device in which the faces of the upper and lower unit FET's forms one surface, by pulling out the source electrodes S, the drain electrodes D, and the gate electrodes G to the end portions of the FET units, it is possible to connect all the FET units constituting the device with one another.

Furthermore, the semiconductor device according to the present invention is not limited to the two-layered structure in the aforementioned embodiments but can be applied to three-layered, four-layered, and other multi-layered structures.

In the case of the device according to the present invention, as is apparent from, for example, FIG. 4, two FET units are stacked in such a manner that operation electrodes are joined with each other and accordingly, two FET units operate with substantially one FET area. That is, the effective area as an FET is reduced. That is, in spite of realizing large-current drive, the entire device size is reduced.

By employing the GaN-based FET as an FET unit, this device can have a small ON resistance and can operate under a high temperature with a large current drive.

Explanation will be given on a preferable example of the GaN-based FET used in such a case.

Figure 8:
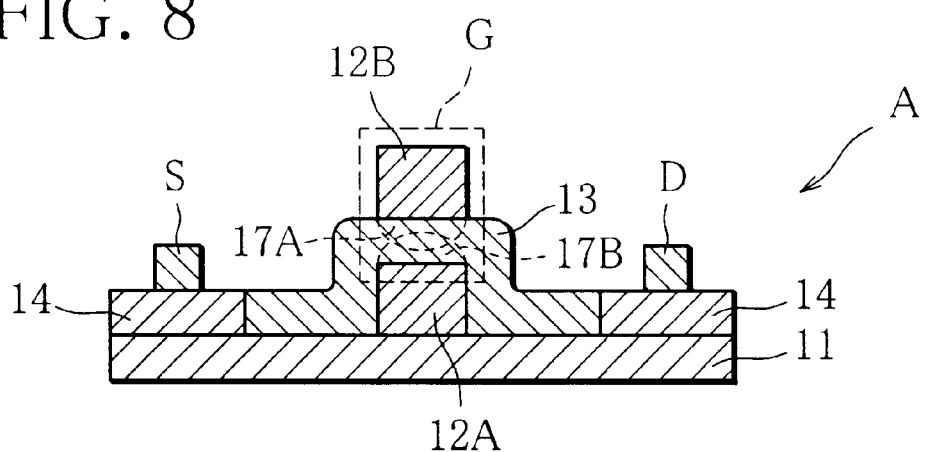
FIG. 8 is a cross sectional view of an example A of the GaN-based FET that can preferably be used in the device according to the present invention.

FIG. 8 shows an example A as a basic structure of a preferable GaN-based FET.

In this GaN-based FET (A), a lower electrode 12A functioning as a lower gate electrode is wired directly on a semi-insulating substrate 11, which is covered by an active layer 13 formed from a GaN-based compound semiconductor. On the upper surface of the active layer 13 is formed a gate electrode 12B.

Here, the gate electrode 12B is wired on the upper surface of the active layer by a predetermined design pattern, and on a surface position of the semi-insulating substrate 11 corresponding to gate electrode 12B, the lower electrode 12A is wired by a design pattern identical to that of the gate electrode 12B. The lower electrode 12A is covered by the active layer 13. Accordingly, as shown by a broken line in FIG. 8, the active layer 13 is vertically sandwiched by the lower electrode 12A and the gate electrode 12B, thereby forming a gate portion G.

At both sides of the active layer 13, more specifically, on the semi-insulating substrate 11 excluding the gate portion G, contact layers 14, 14 are directly arranged, and thereon the source electrode S and the drain electrode D are formed, respectively.

In the case of this FET (A), since the gate portion G consists of the active layer 13 and the two gate electrodes 12A and 12B sandwiching vertically the active layer 13, when these gate electrodes are operated to apply an electric field to the active layer 13, firstly, a depletion layer 17A is formed to spread downward in a channel of the active layer 13 by the gate electrode 12B. Simultaneously with this, a depletion layer 17B is formed to spread upward in the channel of the active layer 13 by the lower electrode 12A.

Accordingly, although one of the gate electrodes cannot make the entire channel of the active layer 13 a depletion layer, the depletion layer is spread by the other gate electrode. As a result, two of the depletion layers are combined to constitute a depletion layer to cut off the channel.

As compared to realization of the pinch-off state by a single gate electrode in the conventional FET, the FET (A) can easily realize the pinch-off state.

In the FET (A) shown in FIG. 8, as the semi-insulating substrate 11, for example, it is possible to use a sapphire substrate, Si substrate, AlN substrate, GaAs substrate, SiC substrate, GaP substrate, and the like. Moreover, it is also possible to use an oxide substrate or glass substrate such as quartz glass.

The lower electrode 12A wired on the semi-insulating substrate 11 and the gate electrode 12B formed on the active layer 13 should be made from the same material. As such a material, for example, it is possible to use Pt, W, Pd, Ag, Au, and Ni.

Moreover, as a materials of the source electrode S and the drain electrode D, materials capable of ohmic junction with the contact layers 14, 14 are used such as Al/Ti/Au formed by successively depositing Al, Ti, and Au on the contact layers or Al/Ti. In addition, for example, it is also possible to use a silicide alloy such as Ti—Si, Al—Si, and Ta—Si.

The active layer 13 can be formed by applying the molecular beam epitaxial method (MBE method) or the metal-organic chemical vapor deposition method (MOCVD method) to a GaN-based compound semiconductor. Moreover, it is also possible to employ the halide vapor phase growth method (HVPE method). To form a high-quality active layer, it is preferable to apply the MBE method.

As the GaN-based compound semiconductor used, there can be exemplified GaN, AlGaN, InGaN, AlInGaN, InGaNAs, InGaNP, and the like.

In the case of this GaN-based FET (A), when forming the active layer 13, for example, conductivity of the active layer is made n-type by doping n-type impurities such as Si, Te, and Sn.

Next, the contact layer 14 on which the source electrode S and the drain electrode D are to be formed with ohmic junction is preferably formed to have low resistance. In case the aforementioned active layer 13 is formed from n-GaN, for example, Si as n-type impurities is preferably doped with a high concentration to obtain an Si doped n-GaN layer. Moreover, as the material of the contact layer, it is also possible to use GaAs, InGaAs, and the like having a smaller band gap than GaN.

The GaN-based FET (A) according to the present invention can be produced as follows. The production process will be explained with reference to the attached drawings.

Figure 9:
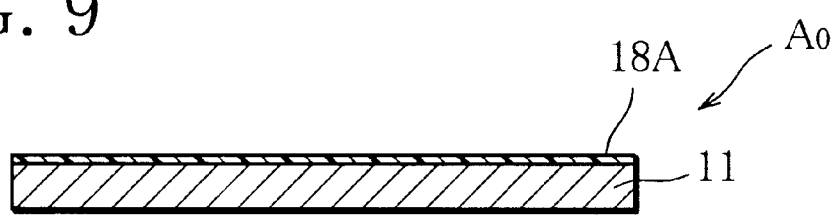
FIG. 9 shows a starting material $A_0$ in cross section, which is used when producing the GaN-based FET (A)

Firstly, as shown in FIG. 9, on a surface of the semi-insulating substrate 11, an insulation film such as $SiN_x$ film 18A is formed by the plasma CVD method for example, thereby producing a starting material $A_0$.

Figure 10:
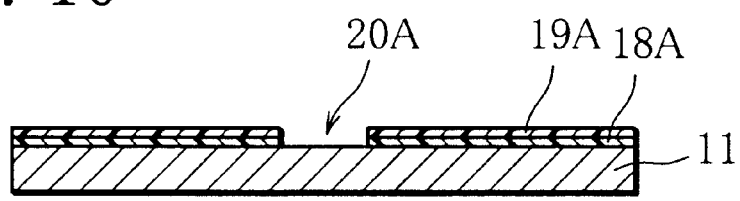
FIG. 10 is a cross sectional view showing a state in which a portion where a lower electrode is to be formed is opened.

Subsequently, photoresist 19A is applied onto the surface of the $SiN_x$ film 18A of the material $A_0$. After performing patterning, the $SiN_x$ film is etched down to the surface of the semi-insulating substrate 11 by the dry etching method such as RIE, thereby forming an opening 20A where a lower electrode is to be formed (FIG. 10). Furthermore, a material of the lower gate electrode is preferably sputtered from this opening 20A onto the exposed surface of the semi-insulating substrate 11 by the ECR (electron cyclotron resonance) using Ar plasma gas, after which the $SiN_x$ film 18A is removed.

Figure 11:
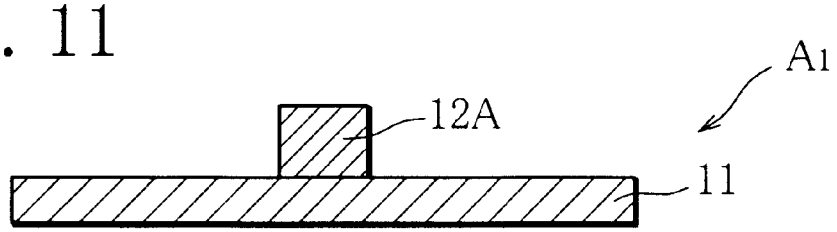
FIG. 11 is a cross sectional view of a material $A_1$ in which the lower electrode is formed.

As a result, as shown in FIG. 11, a material A1 is obtained, in which the lower electrode 12A is wired on a predetermined position of the semi-insulating substrate 11 by a designed pattern.

It should be noted that in this step, the opening 20A on the $SiN_x$ film should be formed with a pattern identical to the gate electrode 12B of the GaN-based FET (A) shown in FIG. 8 as a final production object.

Figure 12:
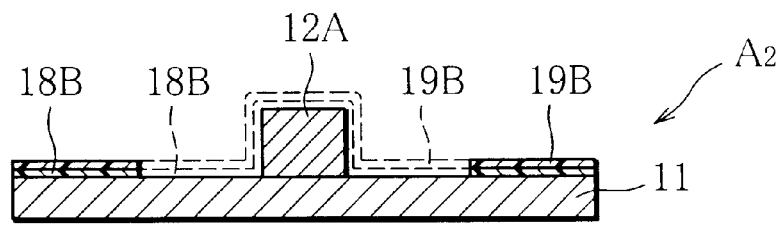
FIG. 12 is a cross sectional view showing a material $A_2$.

Subsequently, an $SiN_x$ film 18B is again formed on the entire surface of the material Al by the plasma CVD method, and photoresist 19B is applied. After performing patterning, the dry etching method such as RIE is performed to obtain a material $A_2$ as shown in FIG. 12. In this material $A_2$, the portions 18B and 19B indicated by broken lines are regions to form the active layer 13 of the GaN-based FET (A) shown in FIG. 8 while the portions 18B and 19B indicated by solid lines are regions to form the contact layer 14.

Figure 13:
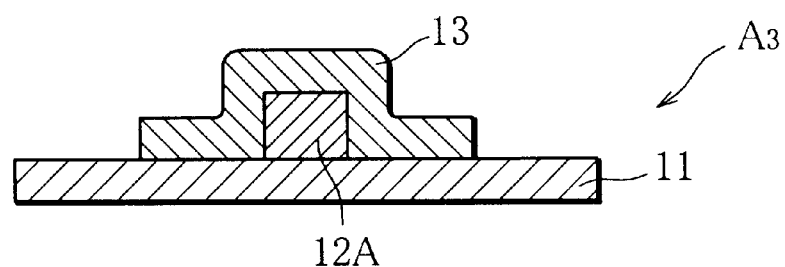
FIG. 13 is a cross sectional view showing a state in which an active layer 13 has been formed.

Next, a predetermined GaN-based compound semiconductor is selectively grown over the entire surface of the material $A_2$, after which the $SiN_x$ 18B is entirely removed by etching. As a result, as shown in FIG. 13, it is possible to obtain a material $A_3$ where the lower electrode 12A is covered by the active layer 13.

Figure 14:
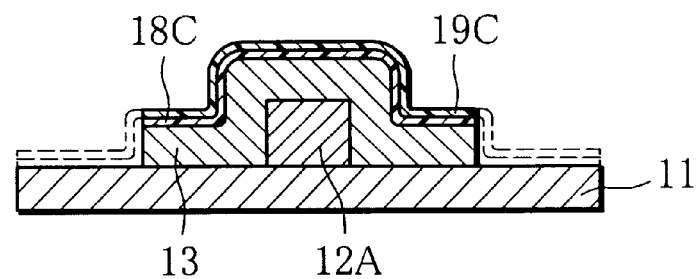
FIG. 14 is a cross sectional view showing a state in which a portion where a contact layer is to be formed is opened.

Next, as shown in FIG. 14, an $SiN_x$ film 18C is grown over the entire surface of the material $A_3$ and thereon photoresist 19C is applied. Patterning is performed so that $SiN_x$ film 18C remains to cover the active layer 13. After this, dry etching such as RIE is performed to remove the portions indicated by the broken line, thereby exposing the surface of the semi-insulating substrate and the side portions of the active layer 13.

Figure 15:
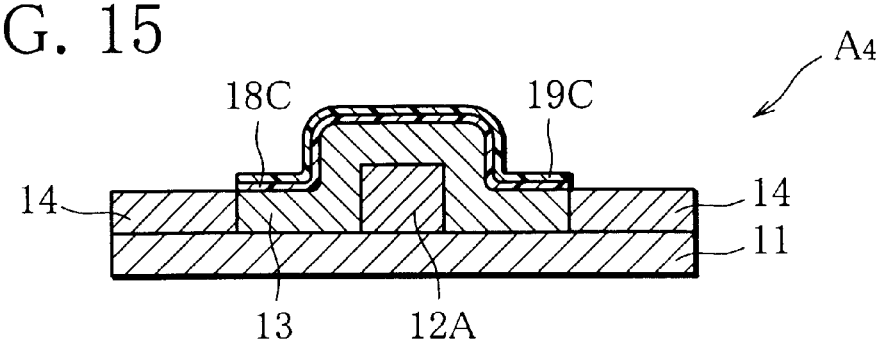
FIG. 15 is a cross sectional view showing a material $A_4$ where the contact layer has been formed.

Subsequently, a predetermined GaN-based compound semiconductor crystal growth is performed, as shown in FIG. 15, so as to obtain a material $A_4$ where contact layers 14, 14 are formed on the aforementioned exposed portions.

Figure 16:
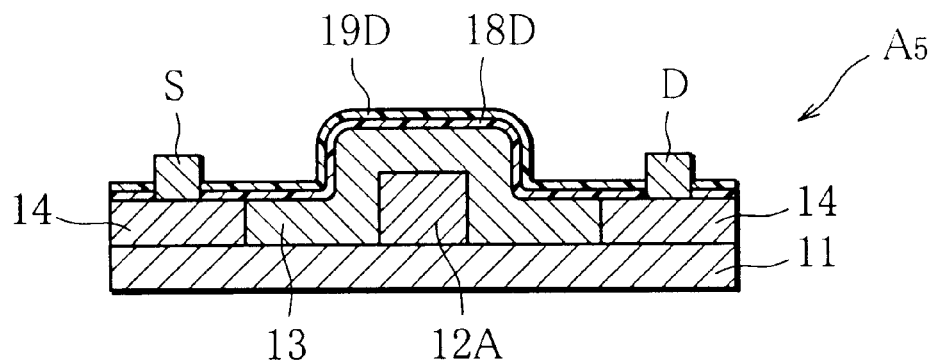
FIG. 16 is a cross sectional view showing a material $A_5$ in a state in which an upper surface of the active layer is exposed outside.

From this material $A_4$, the photoresist 19C and the $SiN_x$ film 18C are removed by the dry etching method. After this, the entire surface is again covered by the $SiN_x$ film 18D as a protection film and photoresist 19D is applied. The portions where the source electrode and the drain electrode are to be formed are removed by the dry etching, where the upper surface of the contact layers 14, 14 are exposed. After this, at these portions, an electrode material is sputtered by the ECR to form the source electrode S and the drain electrode D, thereby producing a material $A_5$ shown in FIG. 16.

Figure 17:
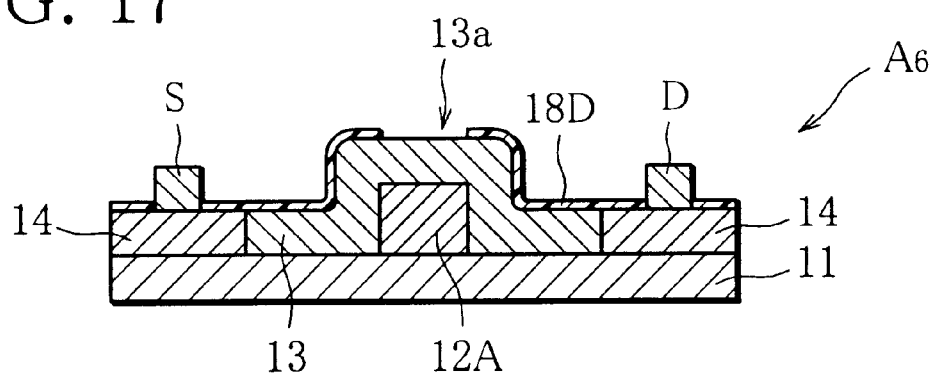
FIG. 17 is a cross sectional view showing a material $A_6$ where a source electrode and a drain electrode have been formed.

Subsequently, the photoresist 19D is removed and the entire surface of the material $A_5$ is covered by a new photoresist. Then, the dry etching method is applied to obtain an opening on the active layer 13 corresponding to a position where a gate electrode is to be formed, thereby exposing an upper surface 13a. Then, the photoresist is removed to obtain a material $A_6$ shown in FIG. 17.

Finally, photoresist is applied to the entire surface of the material $A_6$, and patterning is performed so that all the portions remain excluding the portion where the gate electrode 12B is to be formed. After this, the material identical to the lower electrode 12A is deposited onto the upper surface 13a of the active layer 13, thereby forming the gate electrode 12B. This completes production of the GaN-based FET (A) shown in FIG. 8.

Figure 18:
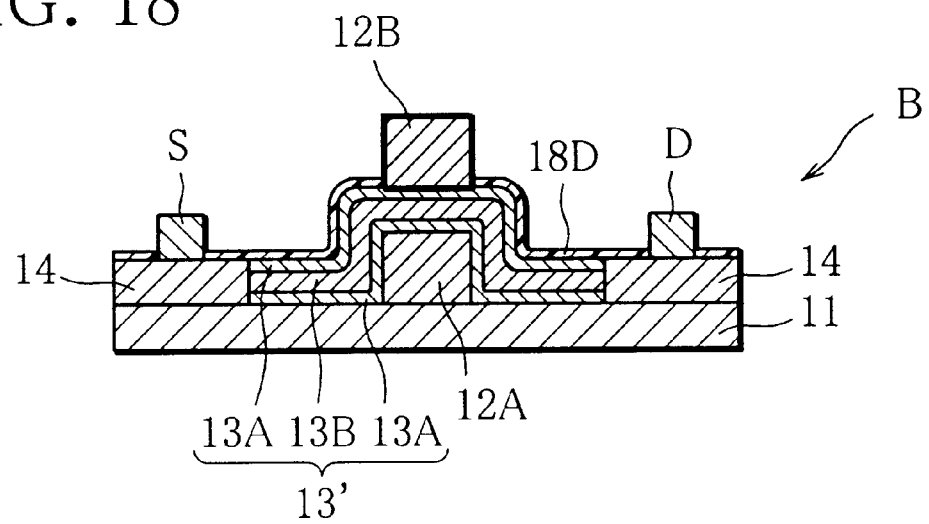
FIG. 18 is a cross sectional view showing another example B of the preferable GaN-based FET.

FIG. 18 shows another preferable example B of the GaN-based FET.

In this GaN-based FET (B), as compared to the GaN-based FET (A) shown in FIG. 8, the active layer 13 corresponds to a layer 13' having a plurality of layers (three layers in the figure).

Here, each layer of the active layer 13' is formed from a GaN-based compound semiconductor. An upper and lower layers 13A, 13A are formed from the same material and an intermediate layer 13B is formed from a material different from the upper and lower layers 13A, 13A. Accordingly, the layered structure has a hetero-junction boundary between the layers. More specifically, the upper and lower layers 13A, 13A can be formed, for example, from non-doped AlGaN while the intermediate layer 13B can be formed from a non-doped GaN.

Moreover, it is possible to use non-doped GaN for the upper and lower layers and non-doped InGaN for the intermediate layer 13B. Furthermore, it is possible to use non-doped AlInGaNAsP for the upper and lower layers and non-doped GaNAsP for the intermediate layer 13B.

In the case of the active layer 13', when voltage is applied between the lower electrode 12A and the gate electrode 12B, a two-dimensional electron gas layer is generated on the hetero-junction boundary of the active layer 13'.

As a result, electron mobility in the channel is increased and large current flows between the source electrode S and the drain electrode D. That is, the ON resistance is reduced.

Explanation will be given on a specific production example of the GaN-based FET (A).

Firstly, the plasma CVD method was used to form an $SiN_x$ film 18A on a sapphire substrate 11 to obtain the material $A_0$ shown in FIG. 9. Subsequently, photoresist 19A was applied onto the $SiN_x$ film 18A. Then, patterning was performed and the $SiN_x$ film 18A was removed by the RIE to form an opening 20A (FIG. 10).

Next, Au and Pt were successively sputtered in an ECR apparatus using Ar plasma gas to form a lower electrode 12A in the opening 20A. After this, the $SiN_x$ film was removed by HF etching process to obtain a material $A_1$ shown in FIG. 11.

On the entire surface of the material $A_1$, an $SiN_x$ film 18B was again formed by the plasma CVD method, and photoresist 19B was applied thereon. Then, patterning was performed to a portion where the active layer 13 was to be formed and an opening was formed by the RIE to obtain a material $A_2$ (FIG. 12).

Next, by using nitrogen ($3 \times 10^{-6}$ Torr), metal Ga ($5 \times 10^{-7}$ Torr), and metal Si ($5 \times 10^{-9}$ Torr), an n-GaN active layer 13 having a thickness of 1 μm to bury the lower electrode 12A was formed by the molecular beam epitaxial method under the growth temperature of 850° C. After this, the $SiN_x$ film was entirely removed by the HF etching process to obtain a material $A_3$ shown in FIG. 13. It should be noted that the Si doping concentration in the active layer 13 made from n-GaN was $2 \times 10^{17}$ cm$^{-3}$.

Again, an $SiN_x$ film 18C was formed on the entire surface of the material $A_3$ and photoresist 19C was applied thereon. After this, patterning was performed so that the $SiN_x$ film 18C remains on the active layer 13 and the RIE was performed to form an opening where a contact layer was to be formed, thereby exposing the surface of the sapphire substrate 1 (FIG. 14).

Next, by applying the molecular beam epitaxial method, radical nitrogen ($3 \times 10^{-6}$ Torr), metal Ga ($5 \times 10^{-7}$ Torr), and metal Si ($8 \times 10^{-8}$ Torr) were used under the growth temperature of 850° C., the Si doped-GaN contact layers 14, 14 having a thickness of 1 μm were formed, thereby producing the material $A_4$ shown in FIG. 15. It should be noted that the Si doping concentration in the contact layers 14, 14 was $2 \times 10^{19}$ cm$^{-3}$.

After completely removing the photoresist 19C and the $SiN_x$ film 18C, again an $SiN_x$ film 18D was formed on the entire surface. Photoresist 19D was applied thereon and patterning was performed. An opening was formed at the portions where the source electrode and the drain electrode were to be formed. In the openings, Al, Ti, and Au were successively sputtered by the ECR using AR plasma gas so as to form the source electrode S and the drain electrode D, thereby producing the material $A_5$ shown in FIG. 16.

Next, the photoresist 19D was removed and a new photoresist was applied. Patterning was performed and an opening was formed where the gate electrode was to be formed, thus exposing the upper surface 13a of the active layer 13 to obtain the material $A_6$ shown in FIG. 17.

Finally, the source electrode S and the drain electrode D were masked and patterning was performed using photoresist to form an opening where the upper gate electrode was to be formed. In the opening, Pt and Au were successively sputtered by the ECR deposition using Ar plasma gas. A Pt/Au deposited on an unnecessary portion was removed by an organic solvent, thus forming the gate electrode 12B and producing the MES-FET type GaN-based FET (A) shown in FIG. 8.

Voltage between the source electrode and the drain electrode of the MES-FET was saturated at 10A. Moreover, withstand voltage exceeded 100V. The ON resistance was not greater than 10 mΩcm$^{-2}$. Furthermore, the FET could operate even under the temperature of 300° C.

What is claimed is:

1. A semiconductor device comprising:
   at least one field effect transistor plainly arranged so as to form one block;
   at least one field effect transistor plainly arranged on the one block so as to form another block; and
   a gate electrode, a source electrode, and a drain electrode formed on the surface of each of the field effect transistors;
   wherein the gate electrode, the source electrode, and the drain electrode of the effect transistor of the one block are directly joined with the gate electrode, the source electrode, and the drain electrode of the field effect transistor of the other block, respectively.

2. The semiconductor device according to claim 1, wherein a joining material for joining the respective electrodes is a metal or an alloy having a melting point of 600° C. or less.

3. The semiconductor device according to claim 1, wherein the field effect transistor comprises a GaN-based compound semiconductor.

4. A GaN-based field effect transistor to be used in the semiconductor device according to claim 1, comprising:
   a lower electrode formed from the same material as a gate electrode to be formed, and plainly patterned on the same plane as the gate electrode directly on a semi-insulating substrate;
- at least one active layer formed from a GaN-based compound semiconductor where the lower electrode is buried; and
- the gate electrode formed on the upper surface of the active layer so that the gate electrode and the lower electrode vertically sandwich the active layer.

5. The GaN-based field effect transistor according to claim 4, wherein the active layer has a three-layer structure, among which a hetero-junction structure is formed.

6. The semiconductor device according to claim 2, wherein the field effect transistor comprises a GaN-based compound semiconductor.

* * * * *